(12) United States Patent
Iida et al.

(10) Patent No.: US 6,782,522 B2
(45) Date of Patent: Aug. 24, 2004

(54) SEMICONDUCTOR DEVICE HAVING WIDE WIRING PATTERN IN OUTERMOST CIRCUIT

(75) Inventors: Taku Iida, Kariya (JP); Satoru Kawamoto, Chita-gun (JP); Toshiaki Yagura, Nukata-gun (JP)

(73) Assignee: Denso Corporation, Kariya (JP)

( * ) Notice: Subject to any disclaimer, the term of this patent is extended or adjusted under 35 U.S.C. 154(b) by 2 days.

(21) Appl. No.: 10/291,419

(22) Filed: Nov. 12, 2002

(65) Prior Publication Data

US 2003/0159122 A1 Aug. 21, 2003

(30) Foreign Application Priority Data

Feb. 19, 2002  (JP) ........................................ 2002-041225

(51) Int. Cl.⁷ ............................ G06F 17/50; G06F 9/45
(52) U.S. Cl. ................................ 716/15; 716/12; 716/8
(58) Field of Search ............................ 716/15, 1, 8, 12

(56) References Cited

U.S. PATENT DOCUMENTS 6,594,811 B2 * 7/2003 Katz ........................... 716/12

FOREIGN PATENT DOCUMENTS

JP          A-2002-94246          3/2002

* cited by examiner

Primary Examiner—Vuthe Siek
Assistant Examiner—Sun James Lin
(74) Attorney, Agent, or Firm—Posz & Bethards, PLC (57) ABSTRACT

A semiconductor electronic part, having a lot of bumps allocated in a checkered pattern, is solder-mounted on a multilayer circuit board. In the multilayer circuit board, a first wiring pattern linked with a first land is finer than a second wiring pattern linked with a second land. Only one first wiring pattern is passable between lands. The second lands are allocated in the outmost line on the uppermost layer of the multilayer circuit board. In the semiconductor electronic part, bumps connectable with the second lands are allocated in the outermost line.

20 Claims, 6 Drawing Sheets

SEMICONDUCTOR DEVICE HAVING WIDE WIRING PATTERN IN OUTERMOST CIRCUIT

CROSS REFERENCES TO RELATED APPLICATIONS

This application relates to and incorporates herein by reference Japanese patent application number 2002-41225, which was filed on Feb. 19, 2002.

FIELD OF THE INVENTION

This invention relates to technology of a terminal and wiring pattern layout when a semiconductor electronic part is mounted on a multilayer circuit board, and technology which enables wide and fine wiring patterns densely to be allocated.

BACKGROUND OF THE INVENTION

There has been a semiconductor device, in which a control circuit IC packaged into a chip size package (CSP) as a control CSP is mounted on a circuit board. Here, the control CSP is connectable by using only a fine wiring pattern for transmitting a signal. Adoption of a multilayer (build-up) circuit board to the control CSP thereby leads to easy wiring design.

However, a CSP for engine control involves a wide wiring pattern for transmitting a power, which needs to find a different wiring design for an efficient layout of the wide wiring pattern.

Figure 7:
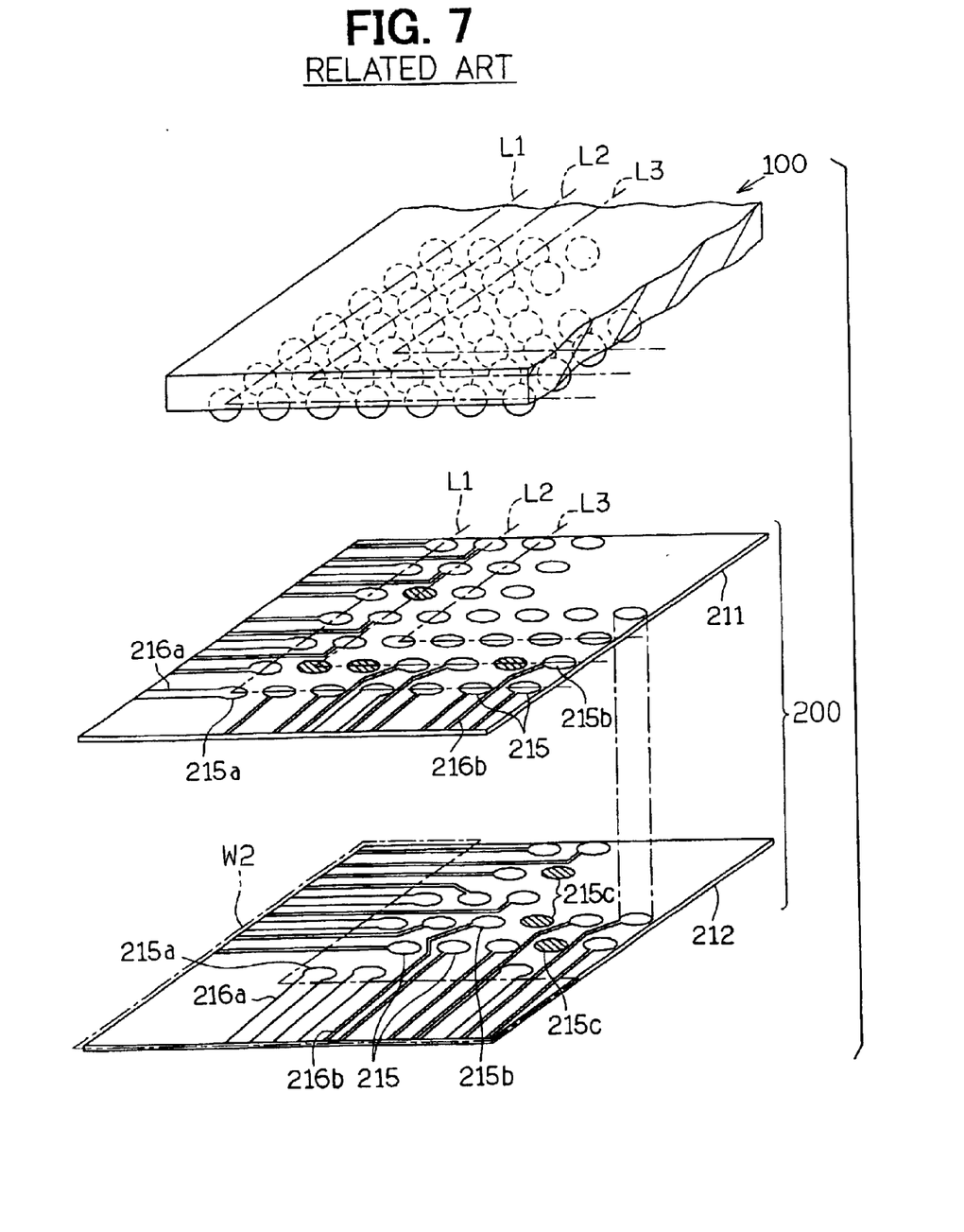
FIG. 7 is an exploded perspective view of a semiconductor device of a related art.

To deal with the wide wiring pattern, it is proposed as shown in FIG. 7. Here, a semiconductor electronic part 100, a CSP, has a fine pitch, so that a corresponding multilayer circuit board 200 has lands 215 between which only one fine wiring pattern 216b can pass as seen in the first layer 211. When the CSP 100 is mounted on the multilayer circuit board 200, wide wiring patterns 216a and the corresponding lands 215a are allocated without any specific consideration. Inefficiency of wiring allocation hence causes a broad area for allocating lands in an inner second layer 212 and useless lands 215c of no wiring pattern connection. This leads to increase of the layer of the multilayer circuit board and disadvantage in costs.

SUMMARY OF THE INVENTION

It is therefore an object of the present invention to provide a semiconductor device in which an efficient wiring layout is enabled to prevent increase of a layer of a multilayer circuit board. Here, in the semiconductor device, a semiconductor electronic part has a fine pitch and terminals connectable with wide wiring patterns, being mounted on the multilayer circuit board. In the multilayer circuit board, only one fine wiring pattern is passable between lands.

To achieve the above object, a semiconductor device has a semiconductor electronic part in which terminals connectable with wide wiring patterns are allocated in at least the first outermost line among the terminals. Furthermore the semiconductor device has a multilayer circuit board in which lands linked with wide wiring patterns are allocated in at least the first outermost line of at least the first uppermost layer of the multilayer circuit board.

In one embodiment of the invention, a semiconductor device has a semiconductor electronic part in which terminals connectable with wide wiring patterns are allocated in the first and third outermost lines. Furthermore, here, the above terminals allocated in the first and third outermost lines are connectable with lands allocated in the first outermost lines of the first and second uppermost layers of the multilayer circuit board, respectively.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
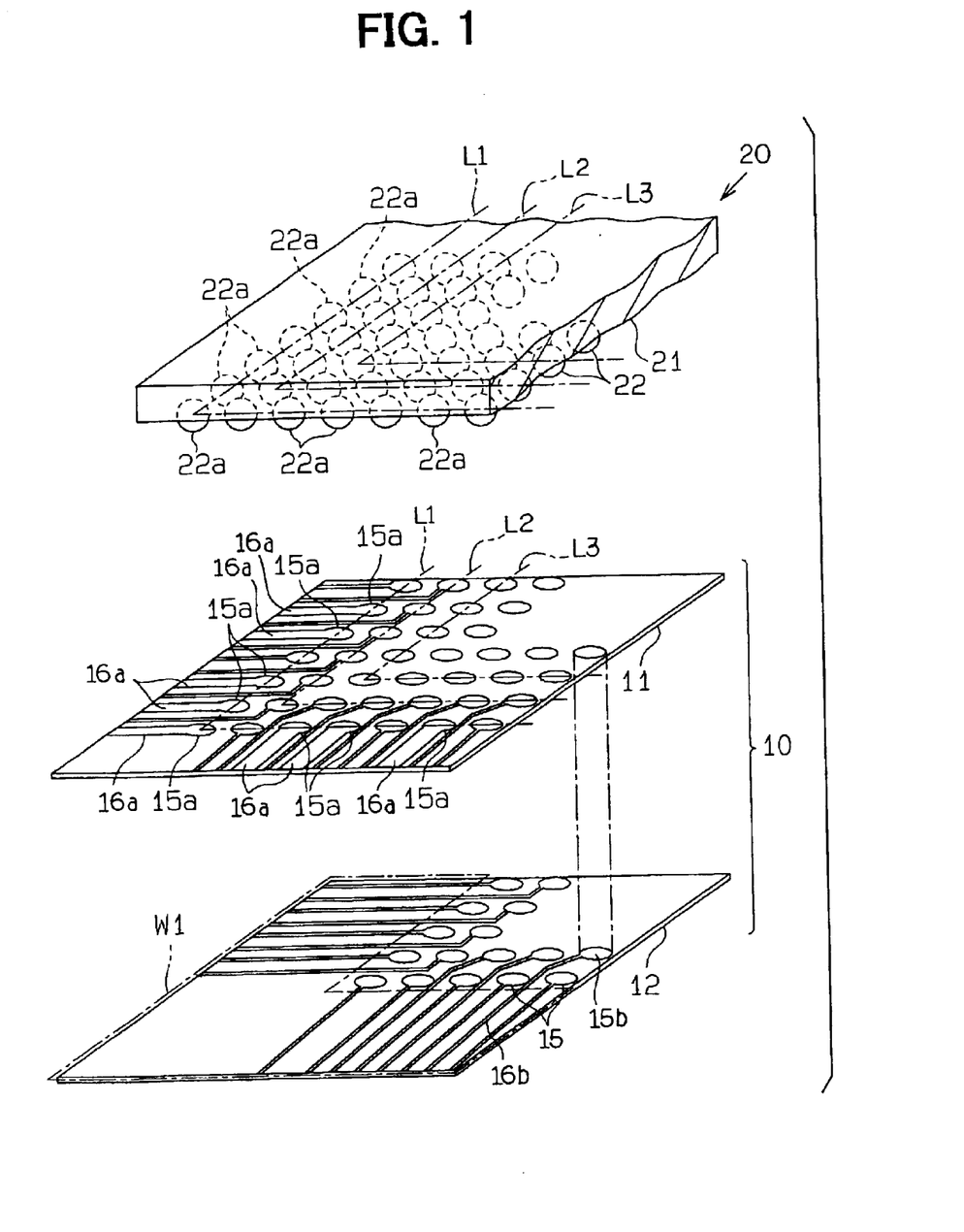
FIG. 1 is an exploded perspective view of a semiconductor device according to a first embodiment of the present invention.
Figure 2:
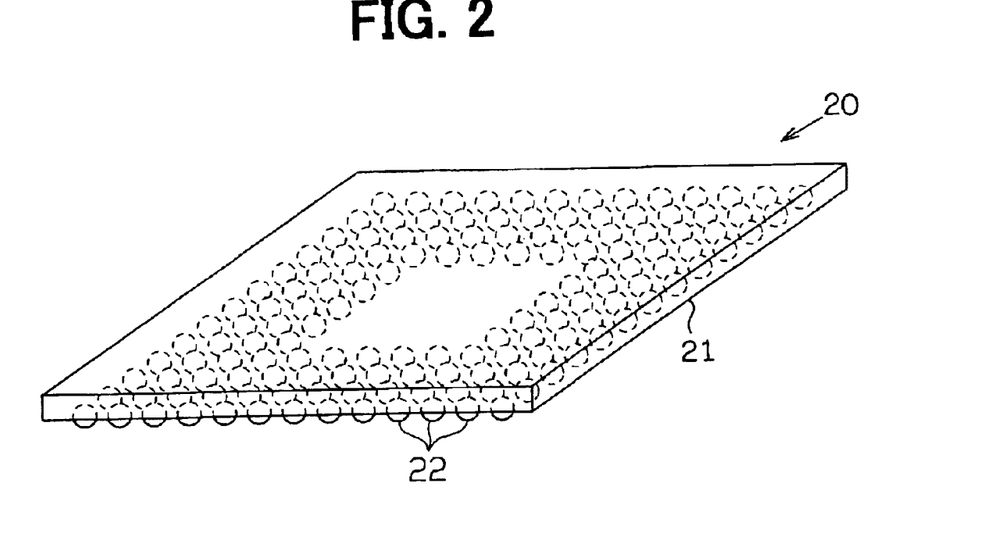
FIG. 2 is a perspective view of a semiconductor electronic part of the first embodiment.
Figure 3:
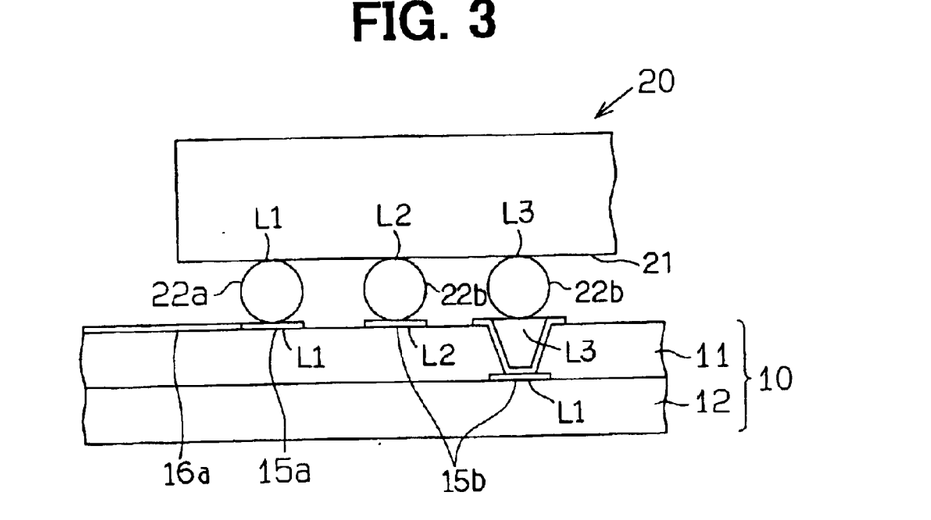
FIG. 3 is a vertical cross-sectional view of the semiconductor device of the first embodiment.

Referring to FIGS. 1, 2 and 3, a semiconductor device of a first embodiment is embodied in an IC (integrated circuit) of an engine control for vehicle driving. In this semiconductor device, a CSP (chip size package) 20 as a semiconductor electronic part is solder-mounted on a multilayer circuit board 10. A plurality of bumps 22 (connecting terminals) are located in a checkered pattern on the substrate bottom 21 of the CSP 20. The bumps 22 are located in a fine pitch.

The multilayer circuit board 10 has at least two layers of the first uppermost layer 11 as the front layer and the second uppermost layer 12 as the inner layer. In the multilayer circuit board 10, wiring patterns 16 (16a, 16b) and the lands 15 (15a, 15b) are formed. Here, a first wiring pattern 16b of the wiring patterns 16 is for transmitting a signal and linked with a second land 15b of the lands 15. Meanwhile a second wiring pattern 16a of the wiring patterns 16 is for transmitting a power and linked with a second land 15a of the lands 15. The second wiring pattern 16a is wider than the first wiring pattern 16b. Only one first wiring pattern 16b is passable between the lands 15.

Bumps 22a, parts of the bumps 22 in the CSP 20, are connectable with the second land 15a of the multilayer circuit board 10, being allocated in the first outermost line L1 among the bumps 22. On the other hand, the second lands 15a are allocated in the first outermost line L1 of the first uppermost layer 11 of the multilayer circuit board 10.

As shown in FIG. 3, a bump 22a for transmitting the power is allocated in the first outermost line L1 of the CSP 20. It is then attached to a second land 15a allocated in the first outermost line L1 of the first uppermost layer 11 of the multilayer circuit board 10. On the other hand, a bump 22b, parts of the bumps 22, for transmitting the signal is allocated in the second outermost line L2 of the CSP 20. It is then attached to a first land 15b allocated in the second outermost line L2 of the first uppermost layer 11 of the board 10. Furthermore, the other bump 22b for transmitting the signal, allocated in the third outermost line L3 of the CSP 20, is connected with a land 15b of the second uppermost layer 12 through a via-hole of the first uppermost layer 11. The bumps 22b and 22a are hence electrically connected with external terminals through the first and second wiring patterns 16b (not shown in FIG. 3) and 16a, respectively.

The wide second wiring pattern 16a is thus drawn from the second land 15a in the first outermost line L1 of the first uppermost layer 11. This avoids interference with other wiring patterns and ensures high efficiency of the wiring layout. This results in dispensing with an expensive multi-layer circuit board of a lot of the layers even in the above case: The CSP 20, having the fine-pitched bumps 22 connectable with the wide wiring patterns 15a, is mounted on the multilayer circuit board 10 where only one fine wiring pattern 16b is passable between the lands 15.

The efficient wiring layout enables a land area used for a land layout to be smaller in the multilayer circuit board 10. Namely, an area W1 outside the land area in FIG. 1 can be larger than an area W2 in FIG. 7.

(Second Embodiment)

Figure 6:
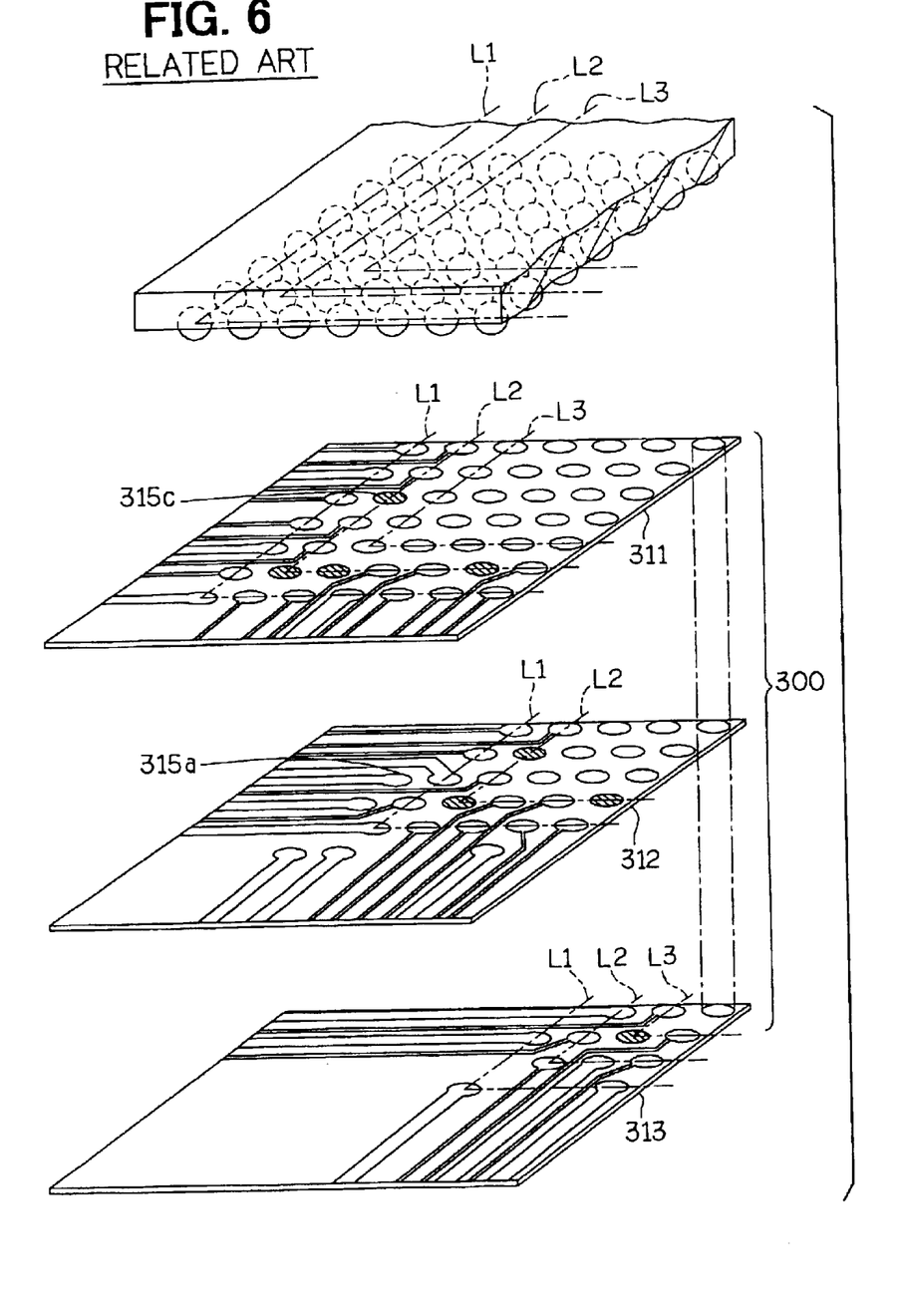
FIG. 6 is an exploded perspective view of a semiconductor device of a related art for comparison with the second embodiment.

When the bumps 22a for transmitting the power are more involved than in the above, the first embodiment may be modified to a second embodiment. At first, for the comparison with the second embodiment to be described later, a related art is explained referring to FIG. 6. Here, Bumps for transmitting the power allocated in other than the odd-numbered outermost lines are connected with other than the first outermost line of each layer 311, 312, and 313 of a multilayer circuit board 300. Here, the efficiency of wiring layout is decreased and a land area in the inner layers 312 and 313 of the multilayer circuit board 300 becomes larger than in the embodiments of the invention. Namely, a bump for transmitting the power is allocated also in the second outermost line so that the first uppermost layer 311 cannot provide the land for transmitting the power in the second outmost line L2 in addition to the first outermost line L1. Therefore the first uppermost layer 311 has a land of no wiring pattern connection 315c and the second uppermost layer 312 needs to have a land 315a for transmitting the power. This results in decreasing the efficiency of the wiring layout in the first uppermost layer 311. Furthermore, the second uppermost layer 312 has a land linked with a wide wiring pattern in the second outermost line L2 in addition to the first outermost line L1. The number of the lands allocated in the first outermost line L1 therefore decreases. This results in decreasing the efficiency of the wiring layout in the second uppermost layer 312.

Figure 4:
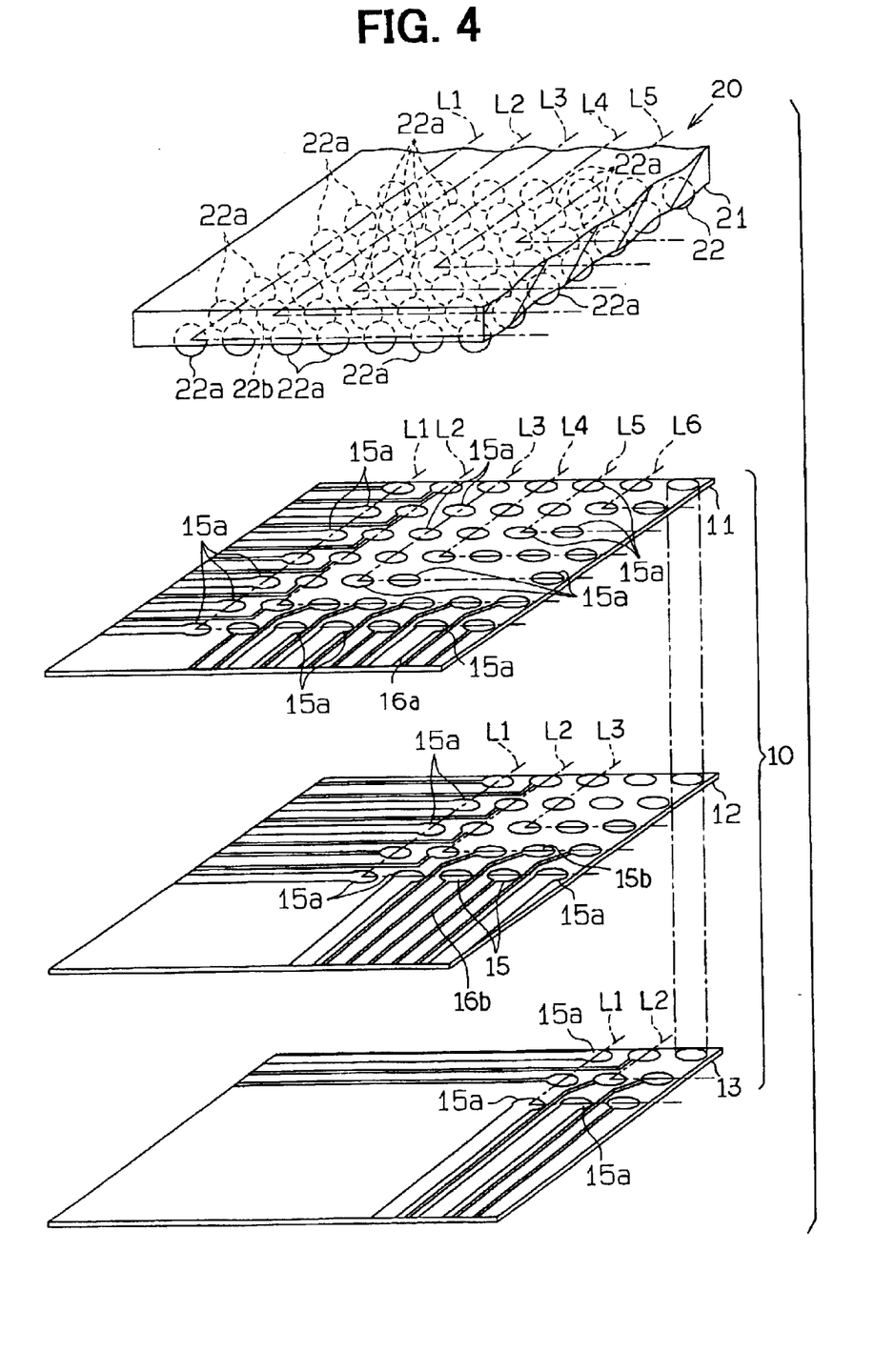
FIG. 4 is an exploded perspective view of a semiconductor device according to a second embodiment of the present invention.
Figure 5:
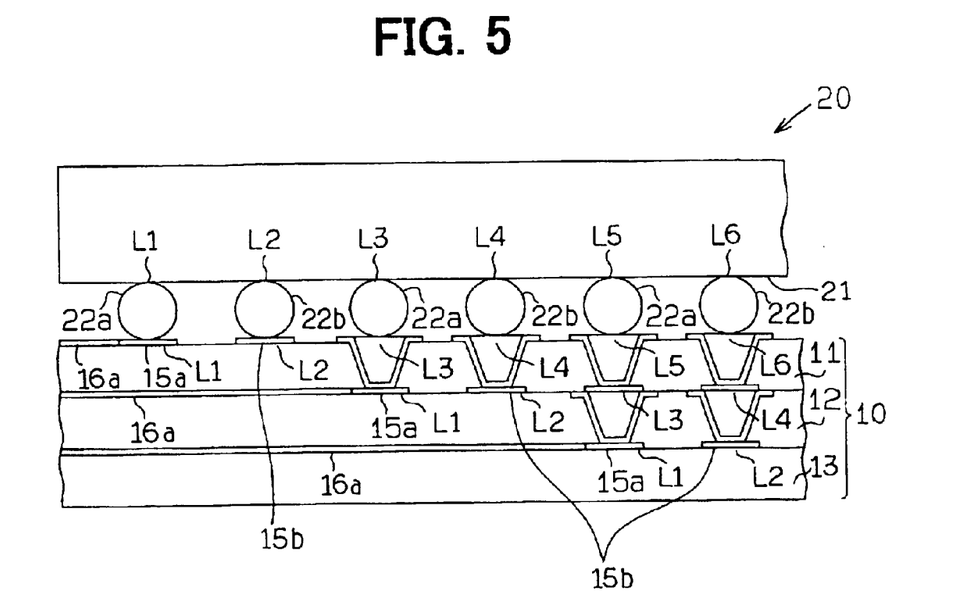
FIG. 5 is a vertical cross-sectional view of the semiconductor device of the second embodiment.

To improve the above inefficiency, the second embodiment is proposed. As shown in FIG. 4, bumps 22a connectable with second lands 15a may be allocated in the several odd-numbered outermost lines such as the first, third and fifth lines L1, L3 and L5 of the CSP 20. Meanwhile, the second lands 15a are allocated in the first outermost line L1 of each of the layers 11, 12 and 13 of the multilayer circuit board 10. Namely, as shown in FIG. 5, the bumps 22a connectable with the second lands 15a are allocated in at least the first and third outermost lines L1 and L3 of the CSP 20. The bumps 22a allocated in the first and third outermost lines L1 and L3 are then attached to the second lands 15a allocated in the first outermost lines L1 of the first and second uppermost layers 11 and 12 of the multilayer circuit board 10, respectively, also shown in FIG. 5.

Specifically, a bump 22a for transmitting the power allocated in the first outermost line L1 of the CSP 20 is attached to a second land 15a in the first outermost line L1 of the first uppermost layer 11. A bump 22b for transmitting the signal allocated in the second outermost line L2 of the CSP 20 is attached to a first land 15b in the second outermost line L2 of the first uppermost layer 11. A bump 22a for transmitting the power allocated in the third outermost line L3 of the CSP 20 is connected with a second land 15a in the first outermost line L1 of the second uppermost layer 12 through a via-hole of the first uppermost layer 11. A bump 22b for transmitting the signal allocated in the fourth outermost line L4 of the CSP 20 is connected with a first land 15b in the second outermost line L2 of the second uppermost layer 12 through a via-hole of the first uppermost layer 11. Moreover, a bump 22a for transmitting the power allocated in the fifth outermost line L5 is connected with a second land 15a in the first outermost line L1 of the third uppermost layer 13 through the via-holes of the first and second uppermost layers 11 and 12.

The wide second wiring patterns 16a are thus drawn from the second lands 15a in the first outermost lines L1 of the layers 11, 12 and 13 of the multilayer circuit board 10. This avoids interference with other wiring patterns and ensures high efficiency of the wiring layout.

What is claimed is:

1. A semiconductor device in which a semiconductor electronic part having connecting terminals in a checkered pattern is solder-mounted on a multilayer circuit board having wiring patterns and lands, the semiconductor device comprising:

first wiring patterns forming a part of the wiring patterns;

first lands forming a part of the lands and linked with the first wiring patterns;

first terminals forming a part of the connecting terminals and connectable with the first lands;

second wiring patterns forming a part of the wiring patterns and wider an the first wiring patterns;

second lands forming a part of the lands and linked with the second wiring patterns; and second terminals forming a part of the connecting terminals connectable with the second lands, wherein two adjoining lands are spaced from each other to allow only one of the first wiring patterns to pass through, the second lands are formed in at least the first outermost line of at least the first uppermost layer of the multilayer circuit board, the second terminals are allocated in at least the first outermost line among the connecting terminals, and wherein no second land is formed in the second outermost line of the first uppermost layer of the multilayer circuit board.

2. A semiconductor device as recited in claim 1, wherein the second lands are further formed in at least the first outermost line of each of other layers in addition to the first uppermost layer of the multilayer circuit board, and wherein he second terminals are further allocated in at least one of odd-numbered outermost lines in addition to the first outermost line among the connecting terminals.

3. A semiconductor device as recited in claim 1, wherein the semiconductor electronic part includes a chip size package.

4. A semiconductor device as recited in claim 1, wherein the first wiring patterns include a wiring pattern for transmitting a signal of the electronic part, and wherein the second wiring patterns include a wiring pattern for transmitting a power of the electronic part.

5. A semiconductor device as recited in claim 1, wherein the second lands are only formed in odd-number outermost lines in addition to the first outermost line in the first uppermost layer of the multilayer circuit board.

6. A semiconductor device as recited in claim 1, wherein the second outermost line in every layer of the multilayer circuit board is only occupied with the first lands connected to the first wiring patterns.

7. A semiconductor device in which a semiconductor electronic part having connecting terminals in a checkered pattern is solder-mounted on a multilayer circuit board having wiring patterns and lands, the semiconductor device comprising:

first wiring patterns forming a part of the wiring patterns;

first lands forming a part of the lands and linked with the first wiring patterns;

first terminals forming a part of the connecting terminals and connectable with the first lands;

second wiring patterns forming a part of the wiring patterns and wider than the first wiring patterns;

second lands forming a part of the lands and linked with the second wiring patterns; and a second terminals forming a part of the connecting terminals an connectable with the second lands, wherein two adjoining lands are spaced from each other to allow only one o the first wiring patterns to pass through, the second terminals are allocated in at least both of the first outermost line and the third outermost line among the connecting terminals, one of the second terminal terminals that is allocated in the first outermost line is connectable with a second land that is allocated in the first outermost line of the first uppermost layer of the multilayer circuit board, another of the second terminals that is allocated in the third outermost line is connectable with a second land that is allocated in the first outermost line of the second uppermost layer of the multilayer circuit board, and no second land is formed in the second outermost line of the first uppermost layer of the multilayer circuit board.

8. A semiconductor device as recited in claim 7, wherein the semiconductor electronic part includes a chip size package.

9. semiconductor device as recited in claim 7, wherein the first wiring patterns include a wiring pattern for transmitting a signal of the electronic part, and wherein the second wiring patterns include a wiring pattern for transmitting a power of the electronic part.

10. A semiconductor device as recited in claim 7, wherein the second lands are only formed in odd-numbered outermost lines in addition to the first outermost line in the first uppermost layer of the multilayer circuit board.

11. A semiconductor device as recited in claim 7, wherein the second outermost line in every layer of the multilayer circuit board is only occupied with the first lands connected to the first wiring patterns.

12. A semiconductor device as recited in claim 7, wherein the firs terminals are allocated in the third outermost line and connected with the first lands of the sec nd uppermost layer through a via-hole of the first uppermost layer.

13. A semiconductor device as recited in claim 7, wherein the second terminals allocated in the third outermost line are connected with the second lands in the second outermost line of the second uppermost layer through a via-hole of the first uppermost layer.

14. A semiconductor device as recited in claim 7, wherein first terminals allocated in a fourth outermost line are connected with the first lands in the second outermost line of the second uppermost layer through a via-hole of the first uppermost layer.

15. A semiconductor device as recited in claim 7, wherein second terminals allocated in a fifth outermost line are connected with the second lands in the first outermost line of a third uppermost layer through via-holes in the first and second uppermost layers.

16. A semiconductor device in which a semiconductor electronic having connecting terminals in a checkered pattern is solder-mounted on a multilayer circuit board having wiring patterns and lands, the semiconductor device comprising:

first wiring patterns forming a part of the wiring patterns;

first lands forming a part of the lands and linked with the first wiring patterns;

first terminals forming a part of the connecting terminals and connectable with the first lands;

second wiring patterns forming a part of the wiring patterns and wider than the first wiring patterns;

second lands forming a part of the lands and linked with the second wiring patterns; and second terminals forming a part of the connecting terminals and connectable with the second lands, wherein two adjoining lands are spaced from each other to allow only one of the first wiring patterns to pass through, the second lands are formed in at least the first outermost line except the second outermost line of the first uppermost layer of the multilayer circuit board, and the second terminals are allocated in at least the first outermost line among the connecting terminals.

17. A semiconductor device in which a semiconductor electronic having connecting terminals in a checkered pattern is solder-mounted on a multilayer circuit board having wiring patterns and lands, the semiconductor device comprising:

first wiring patterns forming a part of the wiring patterns;

first lands forming a part of the lands and linked with the first wiring patterns;

first terminals forming a part of the connecting terminals and connectable with the first lands;

second wiring patterns forming a part of the wiring patterns and wider than the first wiring patterns;

second lands forming a part of the lands and linked with the second win patterns; and second terminals forming a part of the connecting terminals and connectable with the second lands, wherein two adjoining lands are spaced from each other to allow only one of the first wiring patterns to pass through, the second lands are formed in at least the first outermost line of at least the first uppermost layer of the multilayer circuit board, the second terminals are allocated in at least the first outermost line among the connecting terminals, and the first lands and the second lands are regularly aligned in the first outermost line in the second uppermost layer of the multilayer circuit board.

18. A semiconductor device as recited in claim 17, wherein the second lands are formed in at least the first outermost line except the second outermost line of the first uppermost layer of the multilayer circuit board.

19. A semiconductor device in which a semiconductor electronic having connecting terminals in a checkered pattern is solder-mounted on a multilayer circuit board having wiring patterns and lands, the semiconductor device comprising:

first wiring patterns forming a part of the wiring patterns;

first lands forming a part of the lands and linked with the first wiring patterns;

first terminals forming a part of the connecting terminals and connectable with the first lands;

second wiring patterns forming a part of the wiring patterns and wider than the first wiring patterns;

second lands forming a part of the lands and linked with the second win patterns; and second terminals forming a part of the connecting terminals and connectable with the second lands, wherein two adjoining lands are spaced from each other to allow only one of the first wiring patterns to pass through, all lands formed in the second outermost line of the first uppermost layer of the multilayer circuit board are connected to respective wiring patterns, and each of the first wiring patterns and the second wiring patterns extends outwardly on the first uppermost layer of the multilayer circuit board.

20. A semiconductor device as recited in claim 19, wherein all lands formed in the second outermost line in every layer of the multilayer circuit board are connected to respective wiring patterns each extending outwardly on the every layer of the multilayer circuit board.

* * * * *